(12) United States Patent
Xu et al.

(10) Patent No.: US 11,257,957 B2
(45) Date of Patent: Feb. 22, 2022

(54) THIN FILM TRANSISTOR, METHOD OF FABRICATING THE SAME, ARRAY SUBSTRATE AND DISPLAY DEVICE

(71) Applicant: BOE TECHNOLOGY GROUP CO., LTD., Beijing (CN)

(72) Inventors: Pan Xu, Beijing (CN); Yicheng Lin, Beijing (CN); Cuili Gai, Beijing (CN); Baoxia Zhang, Beijing (CN); Quanhu Li, Beijing (CN); Ling Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/620,663

(22) PCT Filed: Jun. 26, 2018

(86) PCT No.: PCT/CN2018/092834
§ 371 (c)(1),
(2) Date: Dec. 9, 2019

(87) PCT Pub. No.: WO2019/007228
PCT Pub. Date: Jan. 10, 2019

(65) Prior Publication Data
US 2020/0176604 A1    Jun. 4, 2020

(30) Foreign Application Priority Data
Jul. 4, 2017    (CN) .......................... 201710538052.8

(51) Int. Cl.
*H01L 21/00* (2006.01)
*H01L 29/786* (2006.01)
(Continued)

(52) U.S. Cl.
CPC ...... *H01L 29/7869* (2013.01); *H01L 27/1225* (2013.01); *H01L 27/1274* (2013.01); *H01L 29/41775* (2013.01); *H01L 29/66969* (2013.01)

(58) Field of Classification Search
CPC ............. H01L 29/7869; H01L 27/1225; H01L 27/1274; H01L 29/41775; H01L 29/66969
See application file for complete search history.

(56) References Cited

U.S. PATENT DOCUMENTS

2013/0248850 A1* 9/2013 Choi ................... H01L 29/7869
257/43
2016/0329362 A1   11/2016 Fang et al.

FOREIGN PATENT DOCUMENTS

CN   103219391 A   7/2013
CN   104218041 A   12/2014
(Continued)

OTHER PUBLICATIONS

The First Office Action with Search Report dated Aug. 28, 2019 corresponding to Chinese application No. 201710538052.8.
(Continued)

*Primary Examiner* — Richard A Booth
(74) *Attorney, Agent, or Firm* — Nath, Goldberg & Meyer; Joshua B. Goldberg

(57) ABSTRACT

The present disclosure provides a thin film transistor, a method of fabricating the same, an array substrate and a display device. The thin film transistor includes: source and drain electrodes in a same layer arranged on a base substrate; an active layer on the base substrate and in contact with the source and drain electrodes; a gate insulating layer at a side of the active layer away from the base substrate; a gate electrode at a side of the gate insulating layer away from the base substrate. Orthographic projections of the gate electrode, the source electrode and the drain electrode on the
(Continued)

base substrate do not overlap with one another, and a region of the active layer not covered by the gate electrode, the source electrode and the drain electrode and at a side of the active layer away from the base substrate is subjected to conductorization.

15 Claims, 8 Drawing Sheets

(51) Int. Cl.
*H01L 27/12* (2006.01)
*H01L 29/417* (2006.01)
*H01L 29/66* (2006.01)

(56) References Cited

FOREIGN PATENT DOCUMENTS

| | | |
|---|---|---|
| CN | 105702744 A | 6/2016 |
| CN | 105932067 A | 9/2016 |
| CN | 106024813 A | 10/2016 |
| CN | 107452808 A | 12/2017 |

OTHER PUBLICATIONS

The Second Office Action with Search Report dated Apr. 16, 2020 corresponding to Chinese application No. 201710538052.8.

* cited by examiner

THIN FILM TRANSISTOR, METHOD OF FABRICATING THE SAME, ARRAY SUBSTRATE AND DISPLAY DEVICE

CROSS REFERENCE TO RELATED APPLICATION

This is a National Phase Application filed under 35 U.S.C. 371 as a national stage of PCT/CN2018/092834, filed Jun. 26, 2018, an application claiming the benefit of Chinese Application No. 201710538052.8, filed Jul. 4, 2017, the content of each of which is hereby incorporated by reference in its entirety.

TECHNICAL FIELD

The present disclosure relates to the field of display technology, and in particular to a thin film transistor, a method of fabricating the same, an array substrate and a display device.

BACKGROUND

Oxide thin film transistors are increasingly widely used due to their high mobility, low leakage current, and well uniformity. Reduction in the size of oxide thin film transistors has become a development trend in the future.

SUMMARY

In one aspect, the present disclosure provides a thin film transistor including: a source electrode and a drain electrode in a same layer arranged on a base substrate; an active layer on the base substrate and in contact with the source and drain electrodes; a gate insulating layer at a side of the active layer away from the base substrate; a gate electrode at a side of the gate insulating layer away from the base substrate. Orthographic projections of the gate electrode, the source electrode and the drain electrode on the base substrate do not overlap with one another, and a region of the active layer not covered by the gate electrode, the source electrode and the drain electrode and at a side of the active layer away from the base substrate is subjected to conductorization.

In an embodiment, a pattern of the gate insulating layer overlaps with the orthogonal projection of the gate electrode on the base substrate.

In an embodiment, the gate electrode, the source electrode and the drain electrode are at a same side of the active layer, and at least a portion of the source electrode and at least a portion of the drain electrode cover the active layer at the side of the active layer away from the base substrate.

In an embodiment, the gate electrode is at an opposite side of the active layer to the source electrode and the drain electrode, a portion of the active layer covers the source electrode at a side of the source electrode away from the base substrate, and another portion of the active layer covers the drain electrode at a side of the drain electrode away from the base substrate. In an embodiment, the source electrode, the drain electrode and the active layer are in a same layer, such that an entire surface of the active layer away from the base substrate is not covered by the source electrode and the drain electrode.

In another aspect, the present disclosure further provides an array substrate, including the thin film transistor described above.

In an embodiment, the array substrate further includes a passivation layer at a side of the thin film transistor away from the base substrate; a conductive electrode at a side of the passivation layer away from the base substrate. A via hole is in a region of the passivation layer corresponding to the drain electrode of the thin film transistor, and the conductive electrode is coupled to the drain electrode through the via hole.

In another aspect, the present disclosure further provides a display device, including the array substrate described above.

In another aspect, the present disclosure further provides a method of fabricating a thin film transistor, including steps of: forming a source electrode, a drain electrode and an active layer on a base substrate, the source electrode and the drain electrode being in a same layer and in contact with the active layer, respectively; forming a gate insulating layer at a side of the active layer away from the base substrate, and forming a gate electrode at a side of the gate insulating layer away from the base substrate, orthographic projections of the gate electrode, the source electrode and the drain electrode on the base substrate not overlapping with one another; and performing a conductorization process on a region of the active layer not covered by the gate electrode, the source electrode and the drain electrode and at the side of the active layer away from the base substrate.

In an embodiment, the step of forming a gate insulating layer and a gate electrode at a side of the active layer away from the base substrate includes: forming a gate insulating material film at the side of the active layer away from the base substrate; forming a gate conductive material film at a side of the gate insulating material film away from the base substrate; coating a photoresist at a side of the gate conductive material film away from the base substrate; performing an exposure process on the photoresist by using a mask plate, and developing the exposed photoresist, the photoresist in a region where the gate electrode is to be formed being completely remained; and etching the gate conductive material film and the gate insulating material film, respectively, to obtain a pattern of the gate electrode and a pattern of the gate insulating layer, an orthographic projection of the pattern of the gate electrode being the same as an orthographic projection of the pattern of the gate insulating layer on the base substrate.

In an embodiment, a material of the active layer is a metal oxide semiconductor. The step of performing a conductorization process on a region of the active layer not covered by the gate electrode, the source electrode and the drain electrode and at the side of the active layer away from the base substrate includes: performing a deoxidation process on the region of the active layer not covered by the gate electrode, the source electrode and the drain electrode and at the side of the active layer away from the base substrate, such that an oxide semiconductor in the region becomes a conductor.

In an embodiment, the step of forming a source electrode, a drain electrode and an active layer on a base substrate includes: forming an active layer material film on the base substrate; patterning the active layer material film to obtain a pattern of the active layer; performing a laser crystallization process on a region of the active layer at the side of the active layer away from the base substrate and not covered by the source electrode and the drain electrode to be formed subsequently; forming a conductive material film at a side of the active layer away from the base substrate; and patterning the conductive material film to obtain patterns of the source electrode and the drain electrode, the source electrode, the drain electrode and the active layer being formed such that at least a portion of the source electrode and at least a portion of the drain electrode cover the active layer at the side of the active layer away from the base substrate.

In an embodiment, the step of forming a source electrode, a drain electrode and an active layer on a base substrate includes: forming a conductive material film on a base substrate; patterning the conductive material film to obtain a pattern of the source electrode and a pattern of the drain electrode; forming an active layer material film at a side of the patterns of the source electrode and the drain electrode away from the base substrate; and patterning the active layer material film to obtain a pattern of the active layer. The source electrode, the drain electrode, and the active layer are formed such that a portion of the active layer covers the source electrode at a side of the source electrode away from the base substrate, and another portion of the active layer covers the drain electrode at a side of the drain electrode away from the base substrate.

BRIEF DESCRIPTION OF THE DRAWINGS

FIG. 3b is a top view of the structure of the thin film transistor of FIG. 3a;

DETAILED DESCRIPTION

In order to make those skilled in the art better understand the technical solution of the present disclosure, a thin film transistor, a method of fabricating the thin film transistor, an array substrate and a display device according to the present disclosure will be described in detail below with reference to the accompanying drawings.

Figure 1:
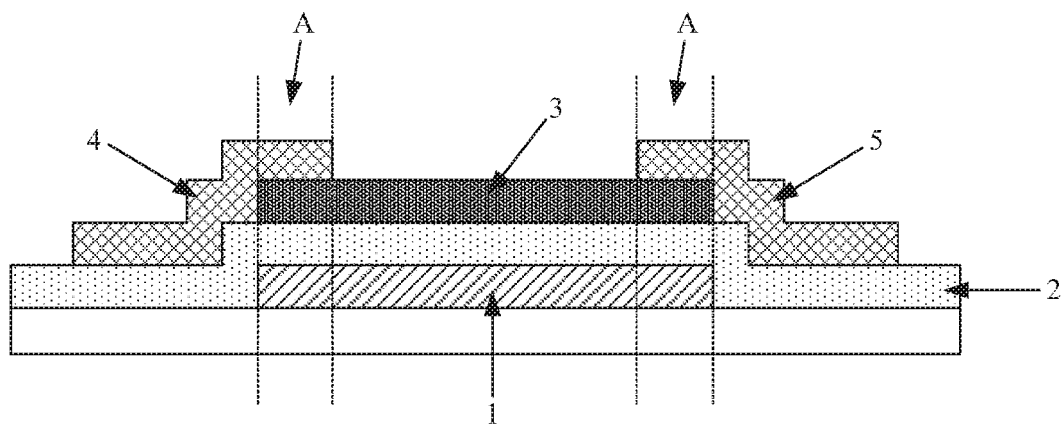
FIG. 1 is a schematic structural diagram of a conventional thin film transistor.

FIG. 1 is a schematic structural diagram of a conventional thin film transistor. As shown in FIG. 1, the thin film transistor is a bottom gate type thin film transistor, that is, a gate electrode 1 is below an active layer 3. In order to form a conductive channel coupling a source electrode 4 and a drain electrode 5 in the active layer 3, the size of the gate electrode 1 is fabricated as large as possible. However, in such a case, a partial region of the gate electrode 1 overlaps with a partial region of the source electrode 4 (and the drain electrode 5), so that a parasitic capacitance may be occurred to an overlapping region A of the conductive channel, thereby affecting the operating characteristics of the thin film transistor.

Figure 2:
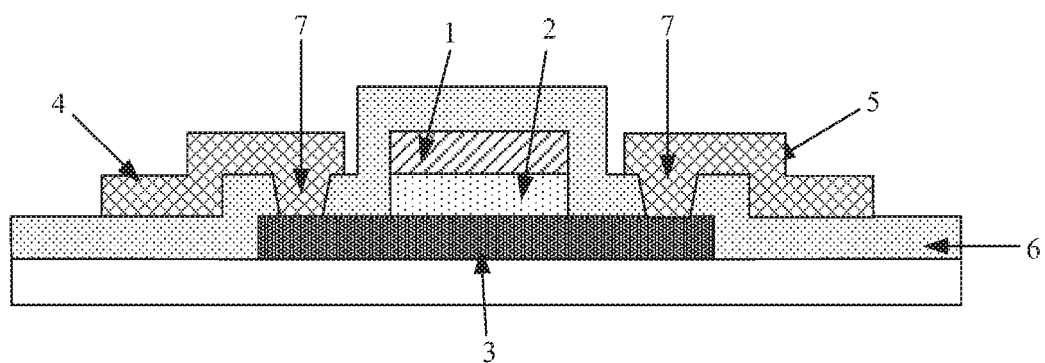
FIG. 2 is a schematic structural diagram of another conventional thin film transistor.

To solve the problem of the parasitic capacitance, there is provided another conventional top gate type thin film transistor. FIG. 2 is a schematic structural diagram of the conventional top gate type thin film transistor. As shown in FIG. 2, in the thin film transistor, the gate electrode 1 is above the active layer 3, the source electrode 4 and the drain electrode 5 are also above the active layer 3, and both the source electrode 4 and the drain electrode 5 are coupled to the active layer 3 through a via hole 7. In such a case, there is no overlapping region between the gate electrode 1 and the source and drain electrodes 4 and 5, so the problem of parasitic capacitance can be effectively avoid.

However, in the thin film transistor shown in FIG. 2, since the via hole 7 is required in a second insulating layer 6 on the active layer 3, the source electrode 4 and the drain electrode 5 formed subsequently can be coupled to the active layer 3 through the via hole 7. Since the via hole 7 needs to occupy a certain volume, the size of the whole thin film transistor is large, which is not favorable for the miniaturization of the thin film transistor and the realization of high resolution of the display panel.

Therefore, how to reduce the size of the thin film transistor while avoiding the occurrence of parasitic capacitance is an urgent technical problem to be solved by those skilled in the art.

Figure 3A:
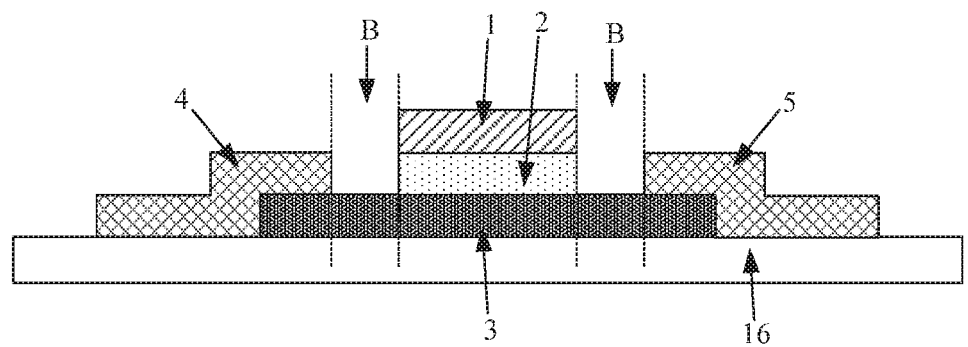
FIG. 3a is a schematic structural diagram of a thin film transistor according to an embodiment of the present disclosure.

FIG. 3a is a schematic structural diagram of a thin film transistor according to an embodiment of the present disclosure. As shown in FIG. 3a, the thin film transistor includes the source electrode 4, the drain electrode 5 and the active layer 3 on the base substrate 16. The source electrode 4 and the drain electrode 5 are in the same layer and are respectively in contact with the active layer 3. the gate insulating layer 2 is formed at a side of the active layer 3 away from the base substrate 16, the gate electrode 1 is formed at a side of the gate insulating layer 2 away from the base substrate 16, orthographic projections of the gate electrode 1, the source electrode 4 and the drain electrode 5 on the active layer 3 do not overlap with one another, and a region B of the active layer 3 not covered by the gate electrode 1, the source electrode 4 and the drain electrode 5 and at the side of the active layer 3 away from the base substrate 16 is subjected to a conductorization process.

Figure 3B:
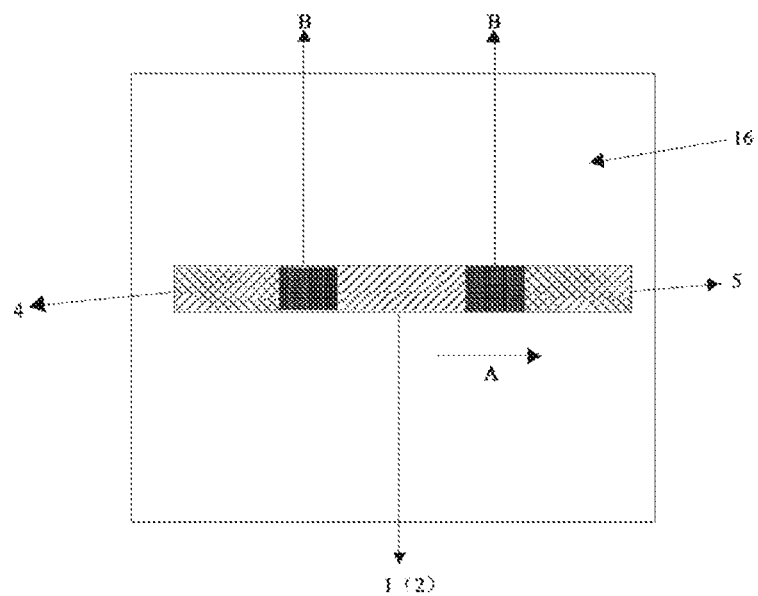

Note that, in FIG. 3a, the region B of the active layer 3, which is not covered by the gate electrode 1, the source electrode 4, and the drain electrode 5 and at the side of the active layer 3 away from the base substrate 16, refers to a region of the active layer 3 (i.e., regions of the active layer 3 between the gate electrode 1 and the source electrode 4 and between the gate electrode 1 and the drain electrode 5, as shown as the region "B" in FIG. 3b) in an extending direction of the gate electrode 1, the drain electrode 5, and the source electrode 4 (i.e., the direction indicated by the arrow "A" in FIG. 3b) except for a region of the active layer 3 covered by the orthographic projection of the gate electrode 1, the orthographic projection of the source electrode 4, and the orthographic projection of the drain electrode 5.

As used herein, the term "in a same layer" refers to the relationship among layers that are formed simultaneously in the same step. In one example, the source and drain electrodes are in the same layer when they are formed as a result of one or more steps of the same patterning process performed in the same material layer. In another example, the source electrode and the drain electrode may be formed in the same layer by simultaneously performing the step of forming the source electrode and the step of forming the drain electrode. The term "in the same layer" does not always mean that a thickness or a height of a layer is the same as another in the sectional view. For example, in FIG. 3a, the source electrode 4 and the drain electrode 5 formed by one patterning process may be understood as being in the same layer.

In some embodiments, the material of the active layer 3 is a metal oxide semiconductor, that is, the thin film transistor is a metal oxide thin film transistor.

In the present disclosure, since the source electrode 4 and the drain electrode 5 are directly in contact with the active layer 3, a via hole is not required to be provided, thereby facilitating the miniaturization of the thin film transistor. Meanwhile, since orthographic projections of the gate electrode 1, the source electrode 4 and the drain electrode 5 on the active layer 3 are not overlapped with one another, no overlapping region exists between the gate electrode 1 and the source and the drain electrodes 4 and 5, and the occurrence of parasitic capacitance can be effectively avoided. It can be seen that the technical solution of the present disclosure can effectively avoid the occurrence of parasitic capacitance while reducing the size of the thin film transistor.

In the embodiment, the gate electrode 1, the source electrode 4 and the drain electrode 5 are at the same side of the active layer 3, and at least a portion of the source electrode 4 and at least a portion of the drain electrode 5 cover the active layer 3.

In the embodiment, optionally, the pattern of the gate insulating layer 2 overlaps with the orthographic projection of the gate electrode 1. In this case, the same mask plate can be used for the patterning of the gate insulating layer 2 and the gate electrode 1, so that the number of the mask plates in the fabricating process can be effectively reduced, and the production cost can be saved. In addition, by overlapping the orthographic projections of the gate insulating layer 2 with the gate electrode 1, the subsequent conductorization process on the region of the active layer, which is not covered by the gate electrode 1, the source electrode 4 and the drain electrode 5 and at the side of the active layer 3 away from the base substrate 16, can be facilitated, and the specific principle can be referred to as the corresponding description below.

Figure 4A:
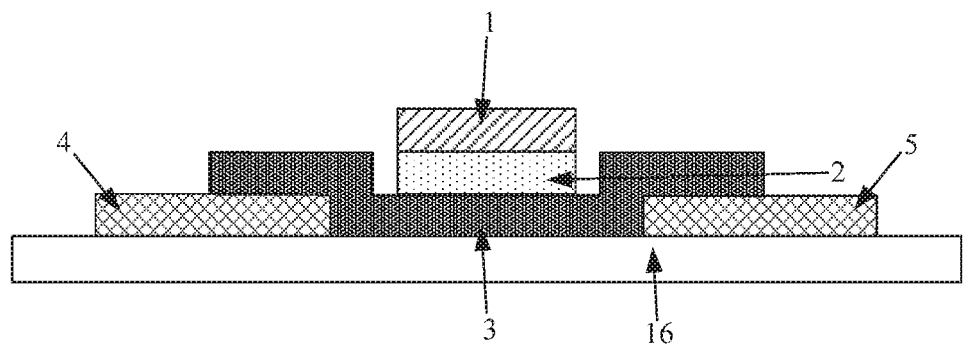
FIG. 4a is a schematic structural diagram of a thin film transistor according to another embodiment of the present disclosure.

FIG. 4a is a schematic structural diagram of a thin film transistor according to another embodiment of the present disclosure. As shown in FIG. 4a, unlike the case where the gate electrode 1 and the source electrode 4 are at the same side of the active layer 3 in the thin film transistor shown in FIG. 3, the gate electrode 1 and the source electrode 4 are at different sides of the active layer 3 in the thin film transistor provided in the embodiment, that is, the gate electrode 1 is at a side of the active layer 3 away from the base substrate 16, and the source electrode 4 and the drain electrode 5 are at a side of the active layer 3 facing the base substrate 16. In other words, a portion of the active layer 3 covers and is in contact with the source electrode 4, another portion of the active layer 3 covers and is in contact with the drain electrode 5, and the remaining portion of the active layer 3 covers and is in contact with the base substrate 16.

It should be noted that, in FIG. 4a, the region of the active layer 3 at the side of the active layer 3 away from the base substrate 16 and not covered by the gate electrode 1, the source electrode 4 and the drain electrode 5 refers to the region of the active layer 3 except for the region covered by the orthographic projection of the gate electrode 1, in the extending direction of the gate electrode 1, the drain electrode 5 and the source electrode 4.

In the present embodiment, only the region of the active layer 3 covered by the orthographic projection of the gate electrode 1 is not subjected to the conductorization process, while the entire region of the active layer 3 not covered by the orthographic projection of the gate electrode 1 is subjected to the conductorization process. In this case, the contact area between the source and drain electrodes 4 and 5 and the portion of the active layer 3 subjected to the conductorization process can be effectively increased, so that the contact resistance between the source and drain electrodes 4 and 5 and the portion of the active layer 3 subjected to the conductorization process can be effectively reduced.

It should be noted that, the case where a region of the active layer 3 covered by the orthographic projections of the source electrode 4 and the drain electrode 5 may be also subjected to the conductorization process is an alternative in the present disclosure, and does not limit the technical solution of the present disclosure. It will be appreciated by those skilled in the art that the normal operation of the thin film transistor can be ensured if only the regions of the active layer 3 not covered by the orthographic projections of the gate electrode 1, the source electrode 4 and the drain electrode 5 are subjected to the conductorization process in the present disclosure.

Figure 4B:
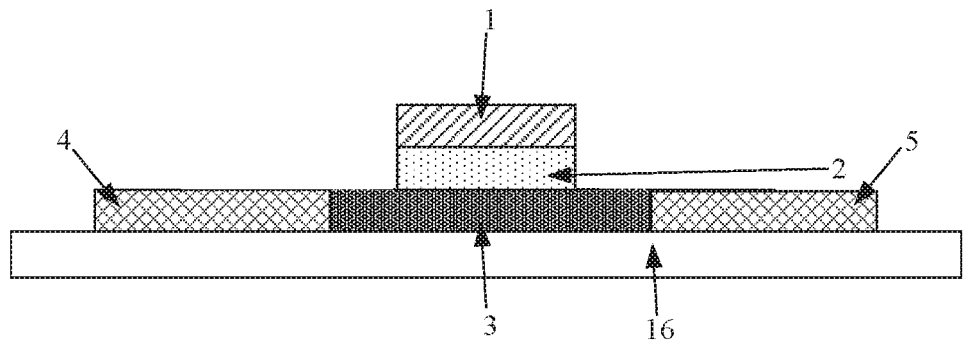
FIG. 4b is a schematic structural diagram of a thin film transistor according to yet another embodiment of the present disclosure.

According to yet another embodiment of the present disclosure, as shown in FIG. 4b, the source electrode 4 and the drain electrode 5 are in contact with the active layer 3, respectively. Unlike the above-described embodiments, the active layer 3, the source electrode 4, and the drain electrode 5 may be in the same layer so that the entire surface of the active layer away from the base substrate is not covered by the source electrode and the drain electrode. It should be noted that, in FIG. 4b, the region of the active layer 3 at the side of the active layer 3 away from the base substrate 16 and not covered by the gate electrode 1, the source electrode 4 and the drain electrode 5 refers to the region of the active layer 3 except for the region covered by the orthographic projection of the gate electrode 1 in the extending direction of the gate electrode 1, the drain electrode 5 and the source electrode 4.

In this case, the active layer 3 and the source and drain electrodes 4 and 5 do not overlap with each other. In this way, the production cost can be reduced.

Figure 5A:
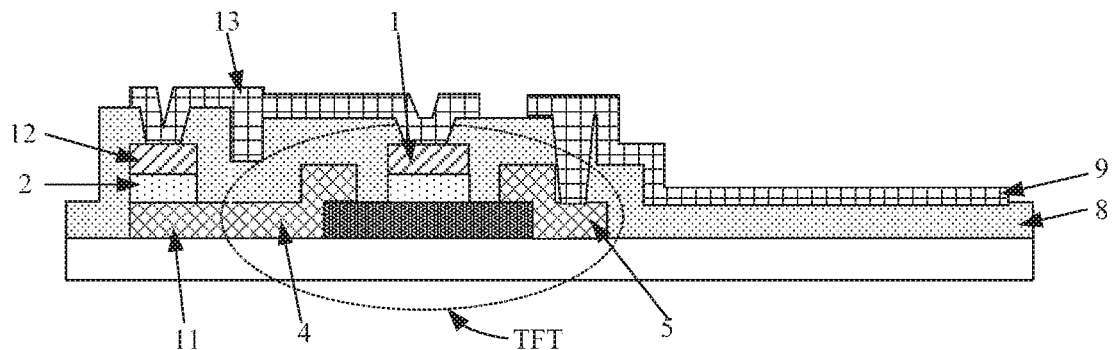
FIG. 5a is a schematic structural diagram of an array substrate according to an embodiment of the present disclosure.

FIG. 5a is a schematic structural diagram of an array substrate according to an embodiment of the present disclosure. As shown in FIG. 5a, the array substrate includes a thin film transistor TFT, which is the thin film transistor provided in the foregoing embodiment (FIGS. 5a and 5b only illustrate the case where the thin film transistor included in the array substrate is the thin film transistor in FIG. 3), and for the description of the thin film transistor TFT, reference may be made to the contents in the foregoing embodiment, and details will not repeated herein.

It should be noted that the array substrate in the embodiment is an array substrate in a liquid crystal display (LCD) panel or an array substrate in an organic light-emitting diode (OLED) panel.

The array substrate further includes a passivation layer 8 at a side of the thin film transistor away from the base substrate 16, and a conductive electrode 9 at a side of the passivation layer 8 away from the base substrate 16, a via hole is formed in a region of the passivation layer 8 corresponding to the drain electrode 5 of the thin film transistor, and the conductive electrode 9 is coupled to the drain electrode 5 through the via hole.

It should be noted that, when the array substrate is an array substrate in an LCD panel, the conductive electrode 9 is a pixel electrode; when the array substrate is an array substrate in an OLED panel, the conductive electrode 9 is an anode of a light emitting diode.

It should be noted that, the array substrate provided in the embodiment may further include a gate line 12 and a data line 11. The gate line 12 and the gate electrode 1 are in the same layer, the data line 11 and the source electrode 4 are in the same layer, the data line 11 is directly coupled to the source electrode 4, and the gate line 12 is electrically coupled to the gate electrode 1 through a conductive wire 13.

In an actual fabricating process, the source electrode 4 and the data line 11 may be simultaneously fabricated through a single patterning process, the gate electrode 1 and the gate line 12 may be simultaneously fabricated through a single patterning process, and the gate insulating layer 2 may be under the gate line 12 to insulate the gate line 12 from the data line 11. In addition, via holes are also formed in the passivation layer 8 at positions corresponding to the gate lines 12 and the gate electrode 1, and the conductive wire 13 is coupled to both the gate lines 12 and the gate electrode 1 through the via holes.

In the embodiment, the conductive wire 13 and the conductive electrode 9 are in the same layer, that is, the conductive wire 13 and the conductive electrode 9 can be simultaneously fabricated by a single patterning process, so that the number of mask plates required in the process can be greatly reduced, and the production cost can be reduced.

Figure 5B:
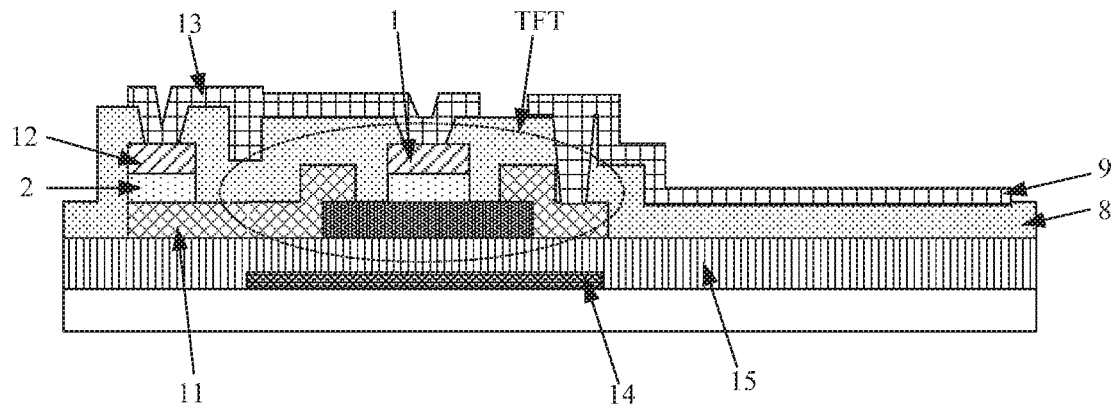
FIG. 5b is a schematic structural diagram of an array substrate according to another embodiment of the present disclosure.

FIG. 5b is a schematic structural diagram of another array substrate according to the embodiment of the present disclosure. As shown in FIG. 5b, when the array substrate is an array substrate in an OLED panel and a light-emitting device on the array substrate is a bottom emission light-emitting device, a light-shielding pattern 14 and an insulating layer 15 is required to be disposed under the thin film transistor TFT. The light-shielding pattern 14 may be coupled to the source electrode or the drain electrode of the thin film transistor TFT to prevent the light-shielding pattern 14 from floating. In an embodiment, the material of the light-shielding pattern 14 is a metal material.

The embodiments of the present disclosure further provide a display device. The display device includes the array substrate in the above embodiments. For the description of the array substrate, reference may be made to the content in the above embodiments, and details will not be repeated herein.

It should be noted that the display device in the embodiment may be any product or component with a display function, such as a liquid crystal panel, electronic paper, an OLED panel, a mobile phone, a tablet personal computer, a television, a display, a notebook computer, a digital photo frame, a navigator or the like.

Figure 6:
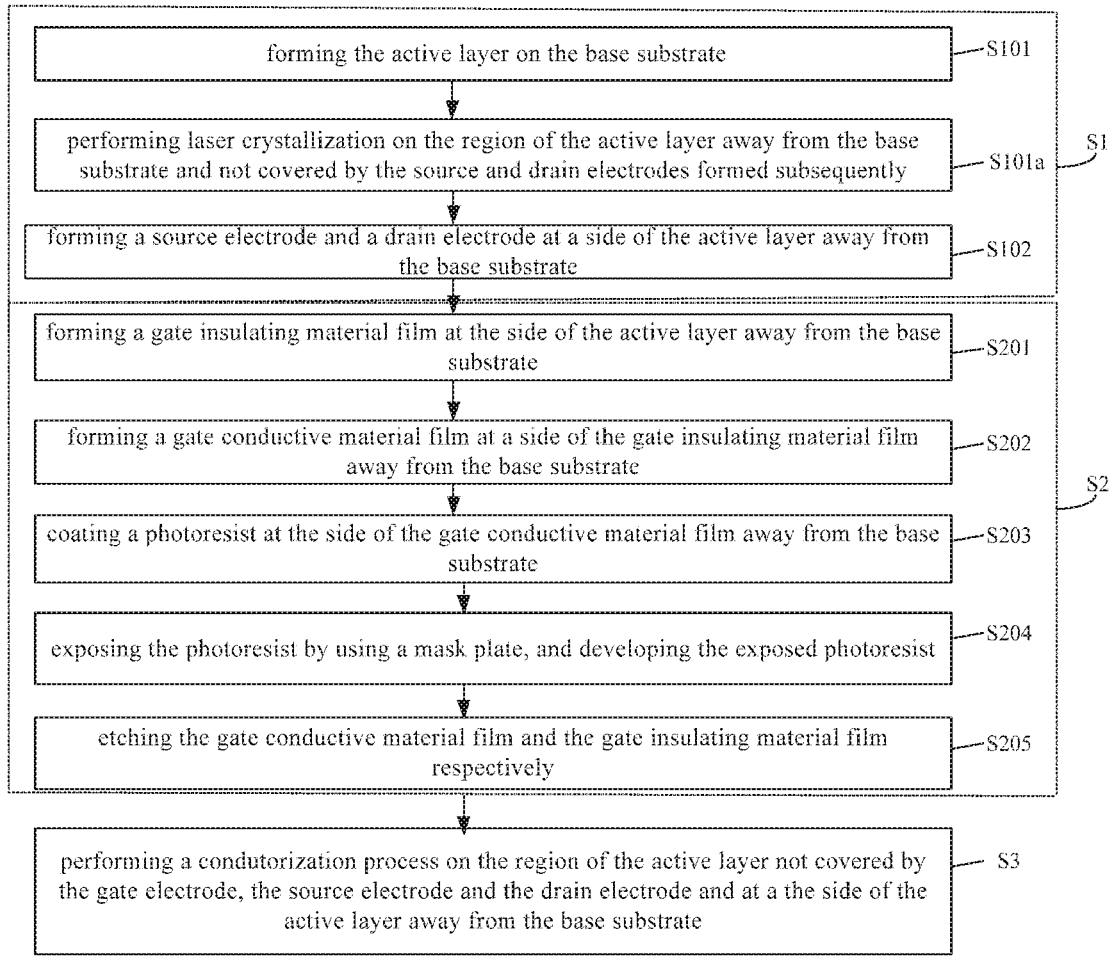
FIG. 6 is a flowchart of a method for fabricating a thin film transistor according to an embodiment of the present disclosure.
Figure 7A:
FIGS. 7a to 7g are schematic intermediate structures of a thin film transistor fabricated by the method shown in FIG. 6.
Figure 7B:
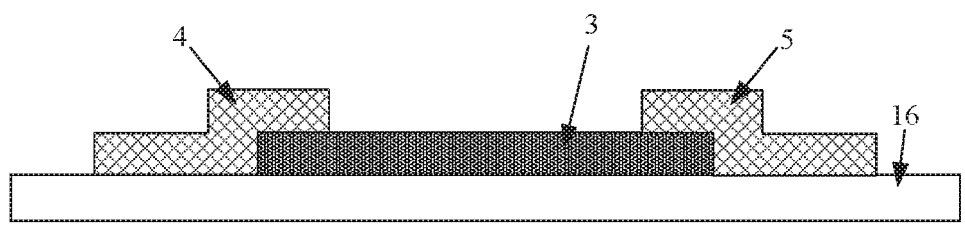
Figure 7C:
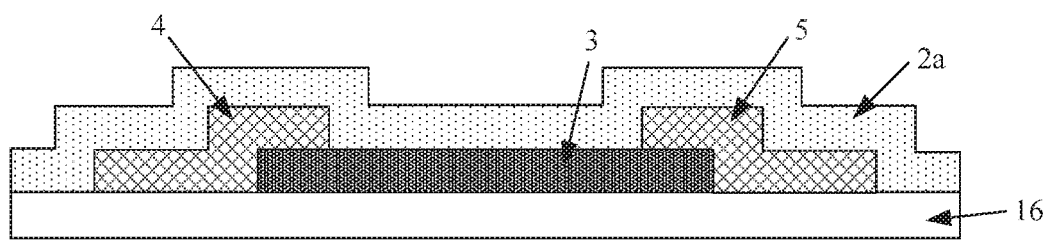
Figure 7D:
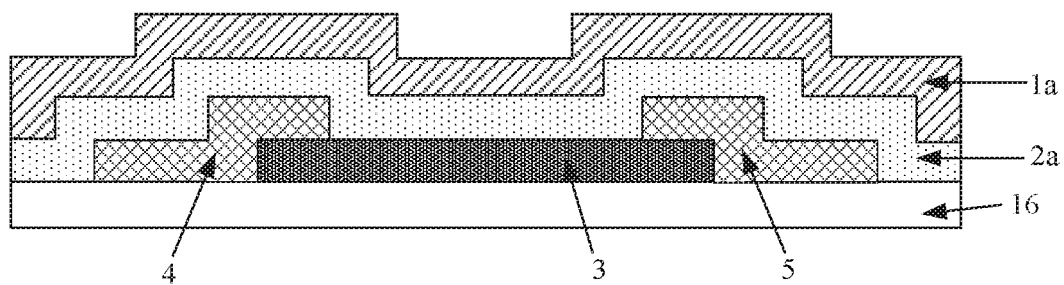
Figure 7E:
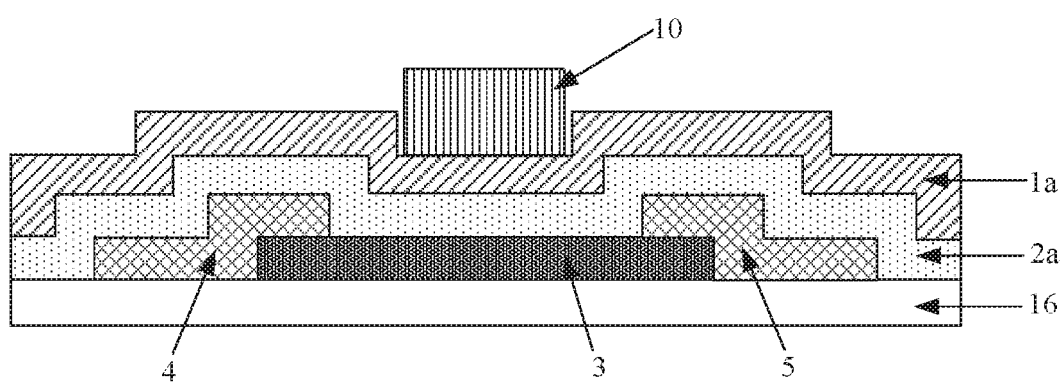
Figure 7F:
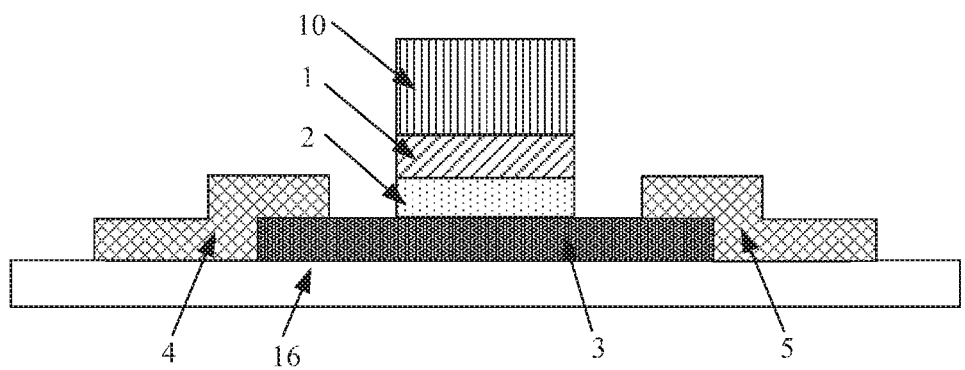
Figure 7G:
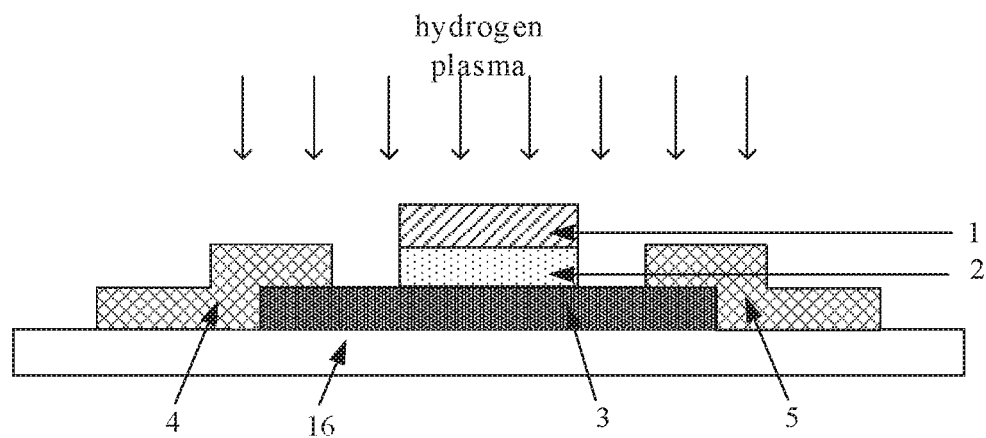

FIG. 6 is a flowchart of a method for fabricating a thin film transistor according to an embodiment of the present disclosure, and FIGS. 7a to 7g are schematic intermediate structures of a thin film transistor fabricated by the fabricating method shown in FIG. 6. As shown in FIGS. 6 to 7g, the method can fabricate the thin film transistor according to the embodiment, and the method includes steps S1 to S3.

In step S1, a source electrode, a drain electrode and an active layer are formed on a base substrate, and the source electrode and the drain electrode are in the same layer and are in contact with the active layer respectively.

In an embodiment, step S1 includes steps 101 and 102.

In step S101, the active layer is formed on the base substrate.

Referring to FIG. 7a, firstly, an active layer material film is formed on the base substrate 16 by a process of coating, magnetron sputtering or vapor deposition. In an embodiment, the active layer material film is a metal oxide semiconductor material. Then, the active layer material film is subjected to a patterning process to obtain a pattern of the active layer 3.

It should be noted that the patterning process in the present disclosure refers to processes including photoresist coating, exposure, development, etching, photoresist stripping, and the like.

In step S102, a source electrode and a drain electrode are formed at a side of the active layer away from the base substrate.

Referring to FIG. 7b, firstly, a conductive material film is formed on the surface of the base substrate 16 and at the side of the active layer 3 away from the base substrate 16 by a process of coating, magnetron sputtering or vapor deposition. In an embodiment, the conductive material film is a metal material. Then, a patterning process is performed on the conductive material film to obtain patterns of the source electrode 4 and the drain electrode 5, and both the source electrode 4 and the drain electrode 5 are in contact with the active layer 3.

Considering that a wet etching is often used when the source electrode 4 and the drain electrode 5 are fabricated by performing a patterning process on the conductive material film, the active layer under the conductive material film may be erroneously etched by the etching liquid. In the embodiment, optionally, between step S101 and step S102, step 1 further includes step S101a.

In step S101a, a laser crystallization process is performed on the region of the active layer away from the base substrate and not covered by the source and drain electrodes to be formed subsequently.

The laser crystallization process is performed in advance on the region of the active layer 3 not covered by the subsequent source electrode 4 and the drain electrode 5, so that the corrosion resistance of the region is enhanced, and the erroneous etch is avoided.

It should be noted that, in the embodiment, the source electrode 4 and the drain electrode 5 may be fabricated firstly, and then the active layer 3 is fabricated (e.g., the case shown in FIG. 4a). In this case, step S1 may include: forming a conductive material film on the base substrate 16; patterning the conductive material film to obtain the pattern of the source electrode 4 and the drain electrode 5; forming an active layer material film at the side of the patterns of the source electrode 4 and the drain electrode 5 away from the base substrate; and patterning the active layer material film to obtain the pattern of the active layer 3.

In step S2, a gate insulating layer and a gate electrode are formed at the side of the active layer away from the base substrate, the gate electrode is at the side of the gate insulating layer away from the base substrate, and orthographic projections of the gate electrode, the source electrode and the drain electrode on the active layer do not overlap with one another.

In an embodiment, step S2 includes steps S201 to S205.

In step S201, a gate insulating material film is formed at the side of the active layer away from the base substrate.

Referring to FIG. 7c, a gate insulating material film 2a is formed on the surface of the base substrate subjected to step S1 by a process of coating, magnetron sputtering or vapor deposition. The gate insulating material film includes at least one of silicon oxide and silicon nitride.

In step S202, a gate conductive material film is formed at a side of the gate insulating material film away from the base substrate.

Referring to FIG. 7d, a gate conductive material film 1a is formed at the side of the gate insulating material film 2a away from the base substrate 16 by a process of coating, magnetron sputtering or vapor deposition. In an embodiment, the conductive material film is a metal material.

In step S203, a photoresist is coated at the side of the gate conductive material film away from the base substrate.

In step S204, an exposure process is performed on the photoresist by using a mask plate, and a development process is performed on the exposed photoresist, and the photoresist in a region where the gate electrode is to be formed is completely remained.

Referring to FIG. 7e, after exposure and development, the photoresist 10 in the region where the gate electrode is to be formed is completely remained.

In step S205, the gate conductive material film and the gate insulating material film are etched to obtain a pattern of the gate electrode and a pattern of the gate insulating layer, respectively, and the pattern of the gate electrode overlaps with an orthographic projection of the pattern of the gate insulating layer on the base substrate.

Referring to FIG. 7f, firstly, the gate conductive material film is etched by a wet etching process to obtain the pattern of the gate electrode 1; and then, the gate insulating material film is etched by a dry etching process to obtain the pattern of the gate insulating layer 2. At this time, the pattern of the gate electrode 1 overlaps the orthographic projection of the gate insulating layer 2 on the base substrate.

After obtaining the pattern of the gate electrode 1 and the pattern of the gate insulating layer 2, the photoresist on the gate electrode 1 is stripped.

In step S3, a conductorization process is performed on the region of the active layer not covered by the gate electrode, the source electrode and the drain electrode and at the side of the active layer away from the base substrate.

Referring to FIG. 7g, a hydrogen plasma is injected towards the surface of the base substrate subjected to step S2, the metal oxide semiconductor in the region (i.e., the region of the active layer 3 except for the region covered by the orthographic projection of the gate electrode 1, the source electrode 4, and the drain electrode 5) of the active layer 3 not covered by the gate electrode 1, the source electrode 4, and the drain electrode 5 and at the side of the active layer away from the base substrate 16 is in contact and reacts with the hydrogen plasma, that is, the hydrogen ions combine with oxygen ions in the metal oxide semiconductor, and the metal oxide in the region is deoxidized and converted into a metal elementary substance to have conductivity (i.e., the metal oxide semiconductor is subjected to the conductorization process).

It should be noted that if the pattern of the gate insulating layer 2 is different from the pattern of the gate electrode 1 in step S2 (e.g., the pattern of the gate insulating layer 2 is larger than the pattern of the gate electrode 1), the portion of the gate insulating layer 2 beyond the gate electrode 1 affects the effect of the conductorization process in step S3, and thus affects the electrical characteristics of the finally formed thin film transistor.

Figure 8:
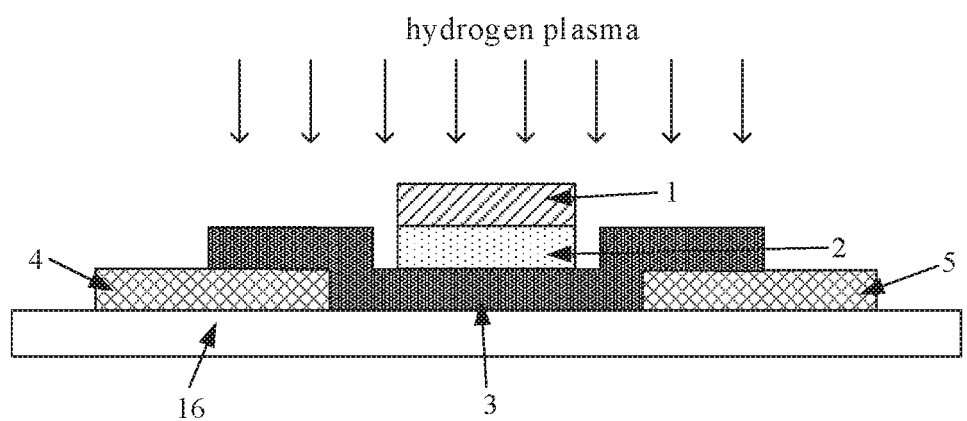
FIG. 8 is a schematic diagram illustrating a conductorization process of an active layer in a case where the active layer is above a source electrode and a drain electrode.

FIG. 8 is a schematic diagram of a conductorization process of an active layer in a case where the active layer is above a source electrode and a drain electrode. As shown in FIG. 8, in step S1, in a case where the source electrode 4 and the drain electrode 5 are fabricated firstly, and then the active layer 3 is fabricated (the active layer 3 is at the side of the source electrode 4 and the drain electrode 5 away from the base substrate 16), the region of the active layer 3 covered by the orthographic projection of the source electrode 4 and the drain electrode 5 is also subjected to the conductorization process when the hydrogen plasma is injected in step S3. In this case, the contact area between the source and drain electrodes 4 and 5 and the portion of the active layer 3 subjected to conductorization process can be effectively increased, so that the contact resistance between the source and drain electrodes 4 and 5 and the portion of the active layer 3 subjected to the conductorization process can be effectively reduced.

It can be seen that, in fabricating the thin film transistor provided by the present disclosure, only the following three mask plates are required: the mask plate for fabricating the source electrode/the drain electrode, the mask plate for fabricating the active layer, and the mask plate for fabricating the gate electrode/the gate insulating layer. The technical solution of the present disclosure can greatly reduce the number of the mask plates in the fabrication process.

It should be noted that, in the fabrication of the array substrate shown in FIG. 5a in the above embodiment, in addition to the steps S1 to S3 (that is, the gate line and the gate electrode are formed by a single patterning process, and the data line and the source electrode/drain electrode are formed by a single patterning process), the method further includes a step of fabricating a passivation layer and a step of fabricating a conductive electrode and a conductive wire after step S3.

Figure 9A:
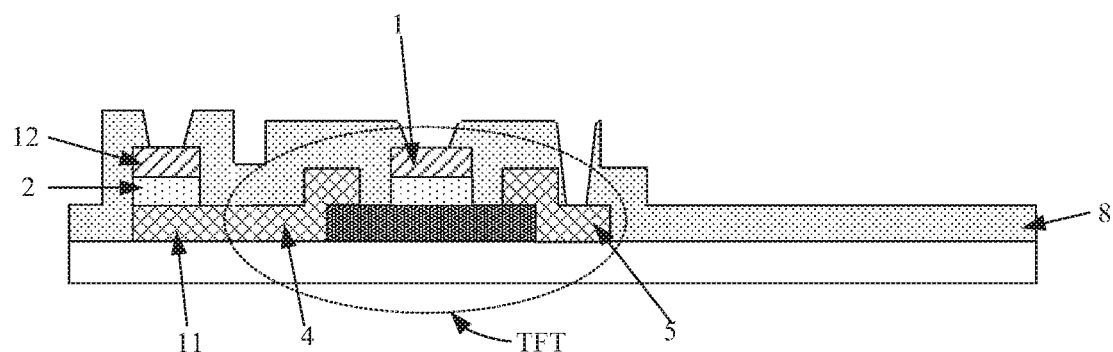
FIG. 9a is a schematic diagram of forming a passivation layer formed above a thin film transistor.

FIG. 9a is a schematic diagram of forming a passivation layer above a thin film transistor. As shown in FIG. 9a, a passivation layer material film is formed on the base substrate subjected to step S3, via holes are respectively formed in regions of the passivation layer material film corresponding to the gate electrode 1, the gate line 12, and the drain electrode 5 through a patterning process, and the remaining passivation layer material film forms a pattern of the passivation layer 8.

Figure 9B:
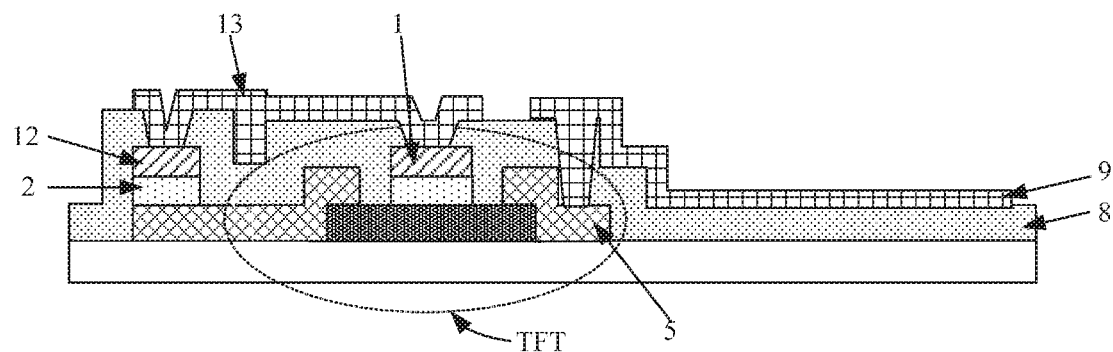
FIG. 9b is a schematic diagram of forming a conductive electrode and a conductive wire on a passivation layer.

FIG. 9b is a schematic diagram of forming a conductive electrode and a conductive wire on a passivation layer. As shown in FIG. 9b, a conductive material film is formed on the passivation layer 8, and patterns of the conductive electrode 9 and the conductive wire 13 are formed through a patterning process.

It can be seen that, in the fabrication of the array substrate shown in FIG. 5a, in addition to the three mask plates required for fabricating the thin film transistor TFT, two additional mask plates are required: a mask plate for forming a via hole on the passivation layer and a mask plate for preparing a conductive electrode/conductive wire. That is, five mask plates are required in the fabrication process of the array substrate.

In addition, when the array substrate shown in FIG. 5b is fabricated, the light-shielding pattern and the insulating layer are also fabricated, and the number of mask plates required is increased correspondingly.

It is to be understood that the above embodiments are merely exemplary embodiments to explain the principles of the present disclosure, and the present disclosure is not limited thereto. Various modifications and improvements may be made by those skilled in the art without departing from the spirit and scope of the disclosure, and are also considered to be within the scope of the disclosure.

What is claimed is:

1. A thin film transistor, comprising:
a source electrode and a drain electrode in a same layer on a base substrate;
an active layer on the base substrate, the active layer extending in a first direction parallel to the base substrate and having two ends opposite to each other in the first direction, and side surfaces of the ends being in contact with the source electrode and the drain electrode, respectively, the active layer being in no contact with upper surfaces of the source electrode and the drain electrode away from the base substrate;
a gate insulating layer at a side of the active layer away from the base substrate;
a gate electrode at a side of the gate insulating layer away from the base substrate,
wherein orthographic projections of the gate electrode, the source electrode and the drain electrode on the base substrate do not overlap with one another, and a region of the active layer not covered by the gate electrode, the source electrode and the drain electrode and at a side of the active layer away from the base substrate is subjected to conductorization.

2. The thin film transistor of claim 1, wherein a pattern of the gate insulating layer overlaps with the orthogonal projection of the gate electrode on the base substrate.

3. The thin film transistor of claim 1, wherein the gate electrode, the source electrode and the drain electrode are at a same side of the active layer, and at least a portion of the source electrode and at least a portion of the drain electrode cover the active layer at the side of the active layer away from the base substrate.

4. The thin film transistor of claim 1, wherein the source electrode, the drain electrode and the active layer are in a same layer, such that an entire surface of the active layer away from the base substrate is not covered by the source electrode and the drain electrode, and orthogonal projections of the active layer, the source electrode and the drain electrode over the base substrate do not overlap with each other.

5. An array substrate, comprising the thin film transistor of claim 1.

6. An array substrate, comprising the thin film transistor of claim 2.

7. An array substrate, comprising the thin film transistor of claim 3.

8. An array substrate, comprising the thin film transistor of claim 4.

9. The array substrate of claim 5, further comprising
a passivation layer at a side of the thin film transistor away from the base substrate;
a conductive electrode at a side of the passivation layer away from the base substrate, wherein a via hole is in a region of the passivation layer corresponding to the drain electrode of the thin film transistor, and the conductive electrode is coupled to the drain electrode through the via hole.

10. A display device, comprising the array substrate of claim 5.

11. A display device, comprising the array substrate of claim 9.

12. A method of fabricating a thin film transistor, comprising steps of:
forming a source electrode, a drain electrode and an active layer on a base substrate, the source electrode and the drain electrode being in a same layer, the active layer extending in a first direction parallel to the base substrate and having two ends opposite to each other in the first direction, and side surfaces of the ends being in contact with the source electrode and the drain electrode, respectively, the active layer being in no contact with upper surfaces of the source electrode and the drain electrode away from the base substrate;
forming a gate insulating layer at a side of the active layer away from the base substrate;
forming a gate electrode at a side of the gate insulating layer away from the base substrate, orthographic projections of the gate electrode, the source electrode and the drain electrode on the base substrate not overlapping with one another; and
performing a conductorization process on a region of the active layer not covered by the gate electrode, the source electrode and the drain electrode and at the side of the active layer away from the base substrate.

13. The method of claim 12, wherein the step of forming a gate insulating layer and a gate electrode comprises:
forming a gate insulating material film at a side of the active layer away from the base substrate;
forming a gate conductive material film at a side of the gate insulating material film away from the base substrate;
coating a photoresist at a side of the gate conductive material film away from the base substrate;
performing an exposure process on the photoresist by using a mask plate, and developing the exposed photoresist, the photoresist in a region where the gate electrode is to be formed being completely remained; and
etching the gate conductive material film and the gate insulating material film, respectively, to obtain a pattern of the gate electrode and a pattern of the gate insulating layer.

14. The method of claim 13, wherein a material of the active layer is a metal oxide semiconductor; and
the step of performing the conductorization process on a region of the active layer not covered by the gate electrode, the source electrode and the drain electrode and at the side of the active layer away from the base substrate comprises:
performing a deoxidation process on the region of the active layer not covered by the gate electrode, the source electrode and the drain electrode and at the side of the active layer away from the base substrate, such that an oxide semiconductor in the region becomes a conductor.

15. The method of claim 12, wherein the step of forming a source electrode, a drain electrode and an active layer on the base substrate comprises:
forming an active layer material film on the base substrate;
patterning the active layer material film to obtain a pattern of the active layer;
performing a laser crystallization process on a region of the active layer at a side of the active layer away from the base substrate and not covered by the source electrode and the drain electrode to be formed subsequently;

forming a conductive material film at the side of the active layer away from the base substrate; and patterning the conductive material film to obtain patterns of the source electrode and the drain electrode, wherein the source electrode, the drain electrode and the active layer are formed such that at least a portion of the source electrode and at least a portion of the drain electrode cover the active layer at the side of the active layer away from the base substrate.

\* \* \* \* \*